United States Patent [19]
Roos
[11] 3,837,860
[45] Sept. 24, 1974

[54] PHOTOSENSITIVE MATERIALS COMPRISING POLYMERS HAVING RECURRING PENDENT O-QUINONE DIAZIDE GROUPS

[76] Inventor: Leo Roos, 36 Riveredge Rd., New Shrewsbury, N.J.

[22] Filed: June 16, 1969

[21] Appl. No.: 833,756

[52] U.S. Cl. .................... 96/91 D, 96/115 R
[51] Int. Cl. .................... G03c 1/52, G03c 1/68
[58] Field of Search .................... 96/91, 115 R

[56] References Cited

UNITED STATES PATENTS

| | | | |
|---|---|---|---|
| 3,046,120 | 7/1962 | Schmidt et al. | 96/33 |
| 3,126,281 | 3/1964 | Süs et al. | 96/91 D |
| 3,264,104 | 8/1966 | Reichel | 96/91 D |
| 3,418,295 | 12/1968 | Schoenthaler | 96/115 R X |
| 3,494,767 | 2/1970 | Laridon et al. | 96/91 D |
| 3,502,470 | 3/1970 | Delzenne et al. | 96/91 D |
| 3,522,049 | 6/1970 | Poot | 96/91 D |
| 3,634,082 | 1/1972 | Christensen | 96/91 D |
| 3,647,443 | 3/1972 | Rauner et al. | 96/91 D |

FOREIGN PATENTS OR APPLICATIONS

| | | |
|---|---|---|
| 723,556 | 1/1969 | Belgium |
| 1,026,144 | 4/1966 | England |

OTHER PUBLICATIONS

Kirk-Othmar "Ency. of Chem. Tech.," Vol. II

*Primary Examiner*—Ronald H. Smith
*Assistant Examiner*—Richard L. Schilling

[57] ABSTRACT

A photosensitive composition which comprises a natural or synthetic polymer having pendent recurring o-quinone diazide groups. The compositions are useful in elements for the preparation of relief images, photoresist applications, etc.

17 Claims, No Drawings

PHOTOSENSITIVE MATERIALS COMPRISING POLYMERS HAVING RECURRING PENDENT O-QUINONE DIAZIDE GROUPS

BACKGROUND OF THE INVENTION

This invention relates to novel photosensitive compositions and more particularly to photosensitive compositions containing a light sensitive binder. This invention also pertains to a novel photoresist element utilizing these compositions.

It is well known in the art of photoresists to utilize polymeric coatings on various supports such as metallic plates as photoresist elements. Upon image-wise exposure, the commonly used photoresists become insolubilized in the exposed areas. These areas will not be washed off, as are the unexposed areas, upon development of the plate in an organic solvent. These commonly used photoresists are usually applied as liquids or require one or more liquid operations in addition to the liquid development step. Polymers used in these liquid resists have been sensitized by the use of photosensitive azides, dichromates or cinnamoyl esters in conjunction therewith.

In Assignee's U.S. Application Celeste Ser. No. 759,217, filed Sept. 11, 1968, now U.S. Pat. No. 3,469,982, and Schoenthaler, U.S. Pat. No. 3,418,295 of Dec. 24, 1968, there are disclosed elements for use in a photoresist process which do not require liquid sensitization or application operations. These elements involve a photopolymerizable layer containing an ethylenically unsaturated compound having low to moderate adherence to a film support and may be provided with a protective film or membrane.

It is desirable in some instances to use a photoresist composition which is of the dry type, but which becomes insoluble in the areas which are unexposed, thus providing a positive working photoresist element.

SUMMARY OF THE INVENTION

It is an object of the present invention to provide a novel photosensitive composition and element. Further objects will become apparent from the following specification and claims.

The photosensitive compositions of this invention comprise a polymer consisting of a macromolecular organic colloid having recurring pendent o-quinone diazide groups. Linkage between the colloid and the azide is provided by esterification of a carboxylic or sulfonic acid present on the quinone rings. Photoresist elements are prepared by coating the photosensitive compositions of this invention on a suitable support by any of the methods well known in the prior art. The composition and element are used in a process for preparing a positive working photoresist as described in Assignee's copending application of Cohen and Heiart, filed of even date, Ser. No. 833,740, now abandoned a continuation of which was filed on Mar. 22, 1971, and has Ser. No. 126,925, now abandoned.

The photosensitive compositions and elements of the present invention differ from the prior art in that upon imagewise exposure, the areas struck by light become desensitized such that they will be soluble in basic solution. The areas of the composition which are untouched by light will remain hard (insoluble) in the presence of a basic solution. Thus the exposed areas will wash out upon development of the element in a basic aqueous or organic solvent, providing a relief image.

DESCRIPTION OF THE PREFERRED EMBODIMENTS

The novel photosensitive compositions of this invention are prepared by esterifying an o-quinone diazide in the presence of a natural or synthetic colloid having pendent hydroxyl groups. A preferred method for making this polymer composition is by esterification of 2-diazo-1-naphthol-4-sulfonyl chloride, in the presence of poly(methyl methacrylate/hydroxyethyl methacrylate). The o-quinone diazides useful in the compositions and elements of this invention have a carboxylic or sulfonic acid constitutent, capable of undergoing esterification, with the pendent hydroxyl groups of the natural or synthetic colloid compound. This esterified colloid is thermally stable to 150°C and is a suitable coating composition for the photosensitive elements of the invention.

The colloids which are useful in the compositions and elements of this invention are synthetic or naturally occurring, and have pendent recurring hydroxyl groups, e.g., polymeric polyols; addition polyesters, e.g., polyacrylic or polymethacrylic acid esters; polyvinyl alcohol, etc.

Photosensitive elements useful in this invention can be made by coating a solution or dispersion of the photosensitive organic polymer onto a thin flexible smooth film base or support and drying the layer by removal or evaporation of any volatile solvent or diluent. The photosensitive layer preferably has a thickness of 0.00005 to 0.003-inch or more, and a support film, if used, a thickness of 0.00025 to 0.005 inch or more. The support preferably is strong, transparent to actinic radiation, dimensionally stable to temperature changes, and has good resistance to solvent action by common solvents. The support should be such, that there is only a moderate amount or degree of adherence between the photosensitive layer and the support, so that the support can be easily stripped in dry condition from the photosensitive layer.

A cover film may be applied by pressing or laminating, e.g., by passing the film and the photosensitive element between rolls. The cover film, if used should have a lesser degree of adherence to the photosensitive layer than does the support.

The photosensitive elements of this invention comprising a substrate having a continuous surface that is in surface contact with the photosensitive layer which is on the support, are prepared by first removing the cover film, if used, from the photosensitive layer. The photosensitive layer while still attached to the support film is then brought into contact with the continuous surface. This can be done by a pressing or laminating procedure similar to that used for applying the cover film.

A preferred embodiment of the element of this invention is prepared by coating a layer of the photosensitive composition described herein on a suitable transparent film support. After drying the photosensitive layer on the support, there is laminated to the surface of the photosensitive layer a strippable cover film. The photosensitive composition is applied to the support to give a dry thickness of about 0.003, although this may be varied readily from 0.0001 inch or less to 0.0005 inch or more. A suitable support film may be chosen from a wide variety of films or foils composed of metals or high polymers, e.g., polyamides, polyofefins, polyesters, vinyl polymers, and cellulose esters and may have a thickness of from 0.00025-inch to 0.008-inch or more. If exposure is to be made before removing the support film, it must, of course, tramsmit a substantial fraction of the actinic radiation incident upon it. No such restrictions apply if the support film is removed prior to exposure. Transparent polyethylene terephthalate is a particularly suitable support film, in a thickness of about 0.001-inch. Suitable removable cover films if used, may be chosen from the group of high polymer films set forth above, and may have the same wide range of thicknesses. The cover film preferably has a lesser degree of adherence to the photosensitive layer than the photosensitive layer has to the support. Support and cover films provide protection for the photosensitive composition.

When the element is ready for use, the cover film is stripped off. The photosensitive film is then laminated to a solid substrate having a smooth surface (e.g., metal, glass, etc.) with heated resilient pressure rolls the photosensitive layer being in contact with the substrate. This provides a laminate comprising sensitized photosensitive layer which is ready for exposure, but is nonetheless protected from environmental contaminants by the original support film.

The element is used as described in Assignee's Cohen and Heiart, U.S Application, filed of even date, Ser. No. 833,740, now abandoned, substantially as follows. The element is exposed imagewise, preferably through the support film. The support is then peeled away, and the exposed area is treated with a basic solution. The element is thus developed by washing away the unhardened exposed areas with a basic solvent. Either an aqueous or an organic solvent may be used in the development process depending on the nature of the colloid used in the photosensitive composition. An aqueous solvent is used when the colloid is a hydrophilic compound, and an organic solvent is used when the colloid is a hydrophobic, oleophilic compound.

The washed out element is useful as a relief or a positive working resist image.

The following examples are intended to further illustrate the invention, however, the scope of the invention is not intended to be limited thereby.

EXAMPLE I

1-Naphthol-4-sulfonic acid sodium salt (0.1 mole) was dissolved in 100 ml water and 20 ml. conc. hydrochloric acid. 10 g sodium nitrite in 25 ml water were added dropwise while keeping the reaction mixture at 0° to 10°C. The solid material that formed was immediately filtered and then dissolved in 5N sodium hydroxide to which was then added 60 g sodium dithionite. After heating for 1 hour at 60°C., the solution was cooled and the amine precipitated as the hydrochloride by addition of HCl. The solid was collected and recrystalized. Diazotization was performed in 100 ml. water containing 20 ml. conc. hydrochloric acid and 1 g copper sulfate. To this mixture at 0° to 10°C was added a 1N sodium nitrite solution. After the reaction was completed, the 2-diazo-1-naphthol-4-sulfonic acid was collected. Ten g of the material were converted into the sulfonyl chloride by reacting in a 3 -fold excess of sulfuryl chloride and precipitating by the slow addition of the cold solution to 1 liter of water containing 500 g ice. Six g of the chloride in 10 ml of dioxane were then esterified by slowly adding a 50 ml. dioxane solution containing 1 g poly(methyl methacrylate/hydroxyethyl methacrylate). The solution was neutralized and dried over calcium chloride (anh.).

This photosensitive composition was coated on 0.001-inch biaxially oriented, heat-set, polyethylene terephthalate to a thickness of 0.0005-inch, and allowed to dry at room temperature.

The photosensitive element was laminated to clean copper-clad epoxy resin Fiberglas board with the photosensitive layer against the copper surface. Lamination was effected by passing between rolls heated to 120°C. The layer was exposed through a negative transparency for 3 minutes, to a 500-watt mercury lamp at a distance of 16 inches, and developed in 5 percent aqueous trisodium phosphate, to yield a positive working resist image, and etched in 45° Baume ferric chloride solution to yield a positive working relief image.

EXAMPLE II

6-Diazo-2,4-cyclohexadien-1-one-4-sulfonic acids was prepared by nitrosating 0.1 mole p-hydroxy benzene-sulfonic acid with 10 g sodium nitrite in 100 ml. 1N hydrochloric acid. The yellow precipitate was reduced by dissolving in 5N sodium hydroxide and reacting with 50 g sodium dithionite. The precipitate was diazotized in 75 ml 1N hydrochloric acid and 10 g. sodium nitrite, and collected. The 6-diazo-2,4-cyclohexadien-1-one-4-sulfonic acid was reacted with a 3-fold excess at 60° C of sulfuryl chloride. After precipitation with water, the acid chloride was esterified in 50 ml dioxane with 2 g partially hydrolyzed (10%) poly(vinylacetate) to give a polymer backbone with pendent o-quinone diazide groups.

The material was coated on 0.0005-inch polyethylene terephthalate to a thickness of 0.0005-inch.

The coated element was allowed to dry at room temperature and then laminated to copper sheet, exposed and processed as in Example I. The resulting image was washed out in the exposed areas. After etching in ferric chloride a positive copper image remained.

EXAMPLE III

The same o-quinone diazide was used as in Example I, except that the sulfonyl chloride was reacted with high molecular weight poly(vinyl alcohol). The composition was coated and dried as in Example II.

The coated element was then pressure-laminated to a translucent glass plate, exposed and washed with warm aqueous 5% trisodium phosphate solution which removed the exposed areas. The plate was suitable for use as a positive working relief image.

EXAMPLE IV

Example III was repeated, except that a coated element was laminated to a steel plate and to an aluminum plate, each being 4-mils thick. The resulting treated plates were useful as positive working relief images.

The embodiments of the invention in which an exclusive property or privilege is claimed are defined as follows:

1. A positive working photosensitive composition comprising a flexible thermoplastic macromolecular polyvinyl alcohol or acrylic polymer having recurrent pendent o-quinone diazide groups chemically bonded to said polymer, said composition being substantially free of groups which will react with photoreaction products of said o-quinone diazide groups, wherein said o-quinone diazide groups are linked to the polymer through a carboxylic or sulfonic ester linkage, and the photoreaction products of said composition have greater solubility in a basic solution than said composition.

2. A composition according to claim 1, wherein said polymer nucleus is of a polyacrylic acid ester.

3. A composition according to claim 1, wherein said polymer nucleus is of a methacrylic acid ester copolymer.

4. A composition according to claim 1, wherein said polymer nucleus is of a poly(methyl methacrylate/hydroxyethyl methacrylate).

5. A composition according to claim 1, wherein the o-quinone diazide groups are 2-diazo-1-naphthol groups linked to the polymer nucleus in the 4-position through a sulfonic acid radical.

6. A composition according to claim 1, wherein the o-quinone diazide groups are 6-diazo-2,4-cyclohexadien-1-one groups linked to the polymer nucleus in the 4-position through a sulfonic acid radical.

7. A composition according to claim 1 in layer form.

8. A composition according to claim 1, wherein said polymer is a polyvinyl alcohol comprised of partially hydrolyzed polyvinyl acetate.

9. A positive working photosensitive element which comprises a support bearing a photosensitive layer comprising a support bearing a photosensitive layer comprising a flexible photosensitive thermoplastic macromolecular polyvinyl alcohol or acrylic polymer having recurring pendent o-quinone diazide groups chemically bonded to said polymer, said layer being substantially free of groups which will react with the photoreaction products of said o-quinone diazide groups, wherein said o-quinone diazide groups are linked to the polymer through a carboxylic or sulfonic ester linkage, and the photoreaction products of said layer have greater solubility in a basic solution than said layer.

10. An element according to claim 9, wherein said polymer has been derived from a polymer of an acrylic acid ester.

11. An element according to claim 9 wherein said polymer has been derived from a copolymer of a methacrylic acid ester.

12. An element according to claim 11 wherein said copolymer is a poly(methyl methacrylate/hydroxyethyl methacrylate).

13. An element according to claim 9 wherein said o-quinone diazide groups of said polymer are 2-diazo-i-napthol groups linked to a colloid nucleus through a sulfonic acid group in the 4-position.

14. An element according to claim 9 wherein said o-quinone diazide groups of the polymer are 6-diazo-2,4-cyclohexadiene-1-one groups linked to a colloid nucleus through a sulfonic acid group in the 4-position.

15. An element according to claim 9 which further comprises a removable cover film laminated to the layer of photosensitive colloid.

16. An element according to claim 9 wherein the degree of adherence between said support and said photosensitive layer is such that said support can be easily stripped in dry condition from said photosensitive layer.

17. An element according to claim 9, wherein said polymer has been derived from partially hydrolyzed polyvinyl acetate.

* * * * *